United States Patent
Chiu et al.

(10) Patent No.: US 7,909,167 B2
(45) Date of Patent: Mar. 22, 2011

(54) WAFER CONTAINER

(76) Inventors: Ming-Chien Chiu, Shulin (TW); Pao-Yi Lu, Shulin (TW); Chin-Ming Lin, Shulin (TW); Kuo-Chun Hung, Shulin (TW)

( * ) Notice: Subject to any disclaimer, the term of this patent is extended or adjusted under 35 U.S.C. 154(b) by 0 days.

(21) Appl. No.: 12/647,102

(22) Filed: Dec. 24, 2009

(65) Prior Publication Data
US 2010/0282638 A1 Nov. 11, 2010

(30) Foreign Application Priority Data

May 8, 2009 (TW) ................................ 98115233 A

(51) Int. Cl.
*H01L 21/673* (2006.01)
(52) U.S. Cl. ........................ 206/710; 206/818
(58) Field of Classification Search .................. 206/710, 206/711, 722, 723, 701, 818
See application file for complete search history.

(56) References Cited

U.S. PATENT DOCUMENTS

| 5,988,392 | A  | * | 11/1999 | Hosoi ........................... 206/711 |
| 6,336,567 | B1 |   | 1/2002  | Hyobu |
| 6,491,177 | B1 |   | 12/2002 | Hyobu |
| 6,758,876 | B2 | * | 7/2004  | Suzuki et al. ................ 55/385.6 |
| 2007/0175792 | A1 |  | 8/2007  | Gregerson |
| 2009/0272743 | A1 | * | 11/2009 | Meulen ........................ 220/230 |

* cited by examiner

*Primary Examiner* — Jacob K Ackun, Jr.
(74) *Attorney, Agent, or Firm* — Ming Chow; Sinorica, LLC

(57) ABSTRACT

A wafer container includes a container body, the internal of which is disposed with a plurality of slots for supporting a plurality of wafers and an opening is formed on one sidewall of which, and a door, which is joined with opening of the container body for protecting the plurality of wafers in the container body, the characteristic in that: a magnetic member is formed at the inner edge of the opening of the container body and a magnet is disposed at the inner surface of the door corresponding to the magnetic member, the magnet being disposed in a magnetic yoke with recessed cross section, with the design of which the magnet on the door attracts the magnetic member at the opening of the container body for the door and the container body to be lock-fastened to each other.

20 Claims, 13 Drawing Sheets

WAFER CONTAINER

BACKGROUND OF THE INVENTION

1. Field of the Invention

The present field of the invention is related to a wafer container, and more particularly, to a wafer container using magnet for sealing and lock-fastening the door and the container body.

2. Description of the Prior Art

The semiconductor wafers are transferred to different stations to apply the various processes in the required equipments. A sealed container is provided for automatic transfer to prevent the is pollution from occurring during transferring process. A front opening unified pod (FOUP) according to the conventional prior art includes a container body and a door. The container body is disposed with a plurality of slots for horizontally supporting a plurality of wafers, and an opening is located on a sidewall of the container body for importing and exporting the wafers. The door includes an outer surface and an inner surface and is joined with the opening of the container body via the inner surface to protect the plurality of wafers within the container body. Moreover, two latch components are disposed between the outer surface and the inner surface of the door, the latch component comprising a cam and a pair of sliding devices in connection with the cam. Therefore, when the cam rotates in certain direction, the free end of the pair of sliding devices extends out of the door and fits into the corresponding insertion hole on the container body for the door and the container body to be lock-fastened to each other.

In the aforementioned FOUP, a seal element is disposed near the opening of the container body; therefore, the free end of the sliding devices presses the seal element of the container body while extending out of the door to achieve the effect of air tightness. However, usually the door is disposed with only two cams and two pairs of sliding devices, and thus the seal element is only pressed by the door on four points, which easily causes defective air tightness of the FOUP. Therefore, as shown in FIG. 1, which is a view of a wafer container of the conventional prior art. The inner surface 220 of the door 200 of the wafer container is disposed with a magnet 250, and at the inner edge of the opening 120 of the container body 100 is disposed with a magnetic component 130 to be attracted by the magnet 250, metal piece for example, the outer surface of the aforementioned magnet 250 and of the magnetic component 130 being coated with seal material. Therefore, when the latch device 240 disposed between the inner surface 220 and the outer surface 210 of the door 200 lock-fastens the container body 100, the magnet 250 attracts the magnetic component 130 for the seal material of the inner surface 220 of the door 200 (i.e. seal material coating the magnet 250) and the seal material on the container body 100 (i.e. seal material coating the magnetic component 130) to contact each other to enhance the effect of air tightness.

And as shown in FIG. 2, which is a view of another wafer container of the conventional prior art. At the inner edge of the opening 120 of the container body 100 of this wafer container are disposed with magnet 140 and a plurality of insertion holes 150. The magnet 140 can attract a magnetic component disposed around the inner surface of the first door (not shown in Figure) for the container body 100 to be lock-fastened with the door via magnetic attraction. Moreover, the same container body 100 can also be lock-fastened with a second door (not shown in figure), between the inner surface and the outer surface of the second door being disposed with cam and sliding devices for the sliding devices to fit into the plurality of insertion holes 150 of the container body 100 via the rotation of the cam. Therefore, the container body 100 can be assembled with door lock-fastened in different forms.

In the above-mentioned wafer container, the magnet 250 and the magnetic component 130 are used to enhance the effect of air tightness. However, since the latch device 240 is disposed between the inner surface 220 and the outer surface 210 of the door 200, the thickness of the door 200 is thus larger and the distance between the front side and the back side of the FOUP cannot be effectively shortened. The other discloses the method to lock-fasten the door and the container body with each other via magnetic attraction. However, the magnetic flux of the magnet may leak into the interior of the container body and affect the stability of circuit of wafers in the container body. In addition, with the magnetic attraction force weakened due to the leakage of the magnetic flux, the door and the container body may thus escape from each other easily during the transportation process of wafer container filled with wafers.

SUMMARY OF THE INVENTION

In wafer container of prior art, there are problems such as defective effect of air tightness, larger thickness of the door, and leakage of magnetic flux. One primary objective of the present invention is thus to provide a wafer container using magnet in the is lock-fastening method, around the inner surface of the door of the wafer container being disposed with magnet and at the inner edge of the opening of the container body being disposed with component that can be attracted by the magnet, metal bar for example. By using this method of lock-fastening, there is no need to dispose the cam and the sliding devices in the door and the thickness of the door can thus be effectively reduced. Moreover, without the operation between the cam and the sliding devices, the particle generation can also be reduced.

Another primary objective of the present invention is to provide a wafer container using magnet in the lock-fastening method. Around the inner surface of the door of the wafer container is disposed with magnet, on the outer surface of which a seal element is further disposed, and at the inner edge of the opening of the container body is disposed with a metal bar. Therefore, when the door and the container body are lock-fastened to each other, the seal element is sandwiched between the magnet and the metal bar for achieving better effect of air tightness of the wafer container.

Still another primary objective of the present invention is to provide a wafer container using magnet in the lock-fastening method. Around the inner surface of the door of the wafer container is disposed with magnet deployed in a magnetic yoke with recessed cross section. Therefore the magnetic flux of the magnet can be effectively guided toward or focused on the inner edge of the opening of the container body and the leakage of magnetic flux in other directions can be prevented for firmly lock-fastening the door and the container body to each other and also enhancing the stability of circuit of the wafers in the container body.

According to above objectives, the present invention discloses a wafer container comprising a container body and a door, the internal of the container body being disposed with a plurality of slots for supporting a plurality of wafers and on one sidewall of the container body being disposed with an opening for importing and exporting the wafers, a magnetic member being disposed at the inner edge of the opening and a magnet deployed in a magnetic yoke with recessed cross section being disposed on the inner surface of the door corresponding to the magnetic member, with the design of which the magnet of the door attracts the magnetic member near the opening of the container body for lock-fastening the door to the container body.

And another wafer container according to the present invention comprises a container body and a door. In this embodiment, the magnet is disposed on the container body and the magnetic member is disposed on the door, with the design of which the door and the container body can also be lock-fastened to each other. On the outer surface of the magnet of the wafer container of the present invention is also disposed with a seal element. Therefore when the door and the container body are lock-fastened to each other, the seal element is firmly sandwiched between the magnet and the magnetic member and the problem of defective effect of air tightness of the wafer container can thus be eliminated.

Furthermore, a wafer container according to the present invention comprises a container body and a door, the internal of the container body being disposed with a plurality of slots for supporting a plurality of wafers and on one sidewall of the container body being disposed with an opening for importing and exporting the wafers, a magnetic member being disposed at the inner edge of the opening and a magnet deployed in a magnetic yoke with recessed cross section being disposed on the inner surface of the door corresponding to the magnetic member, and the door itself being mixed with metal particles. Therefore the magnetic flux of the magnet can be further focused on the inner edge of the opening of the container body for the door and the container body to be even more firmly lock-fastened to each other.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

In order to disclose the skills applied in, the objectives of, and the effects achieved by the present invention in a more complete and clearer manner, preferred embodiments are herein described below in detail with related drawings disclosed for reference.

Figure 1:
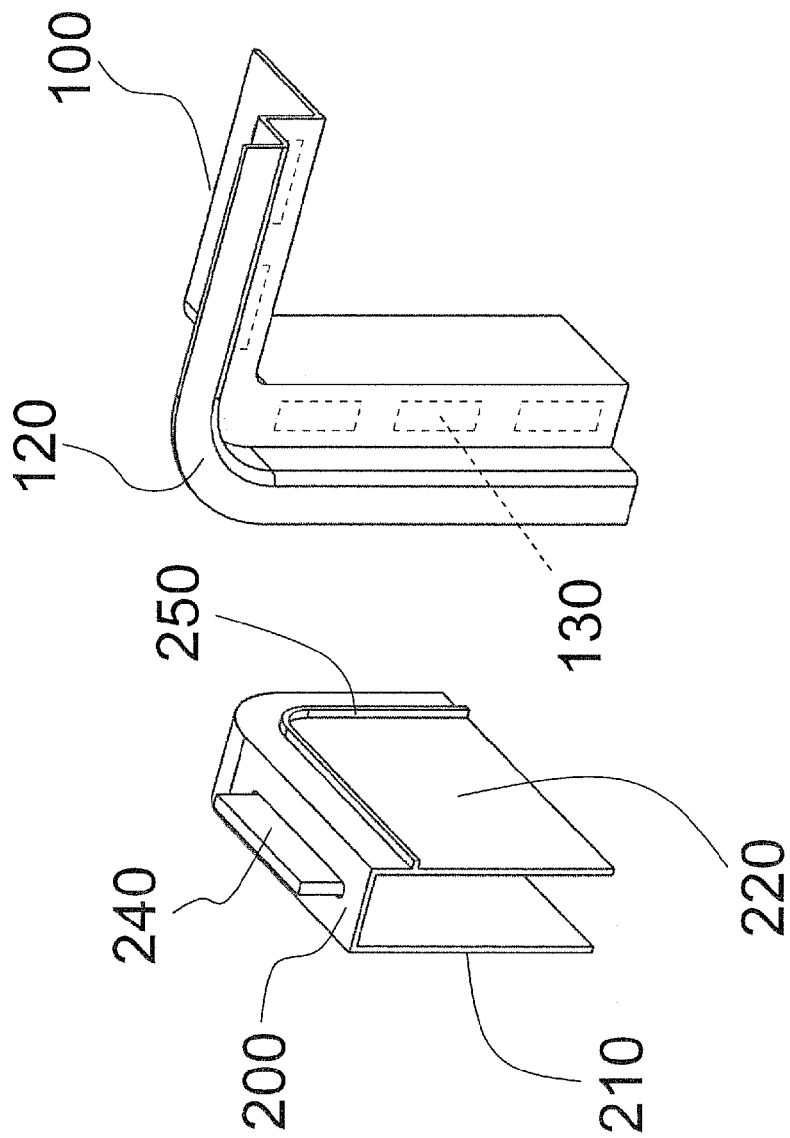
FIG. 1 is a view of a wafer container of the prior art.
Figure 2:
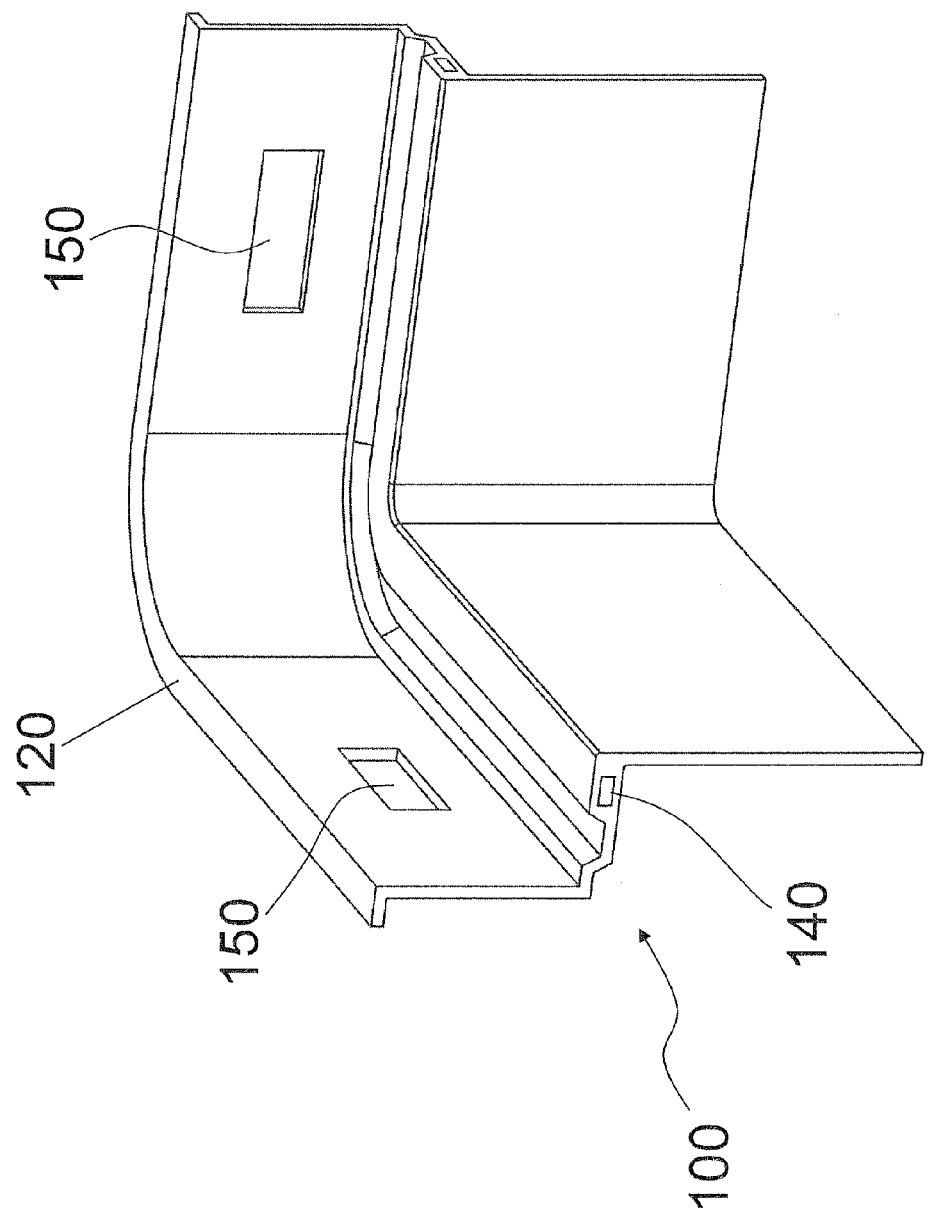
FIG. 2 is a view of another wafer container of the is prior art.
Figure 3:
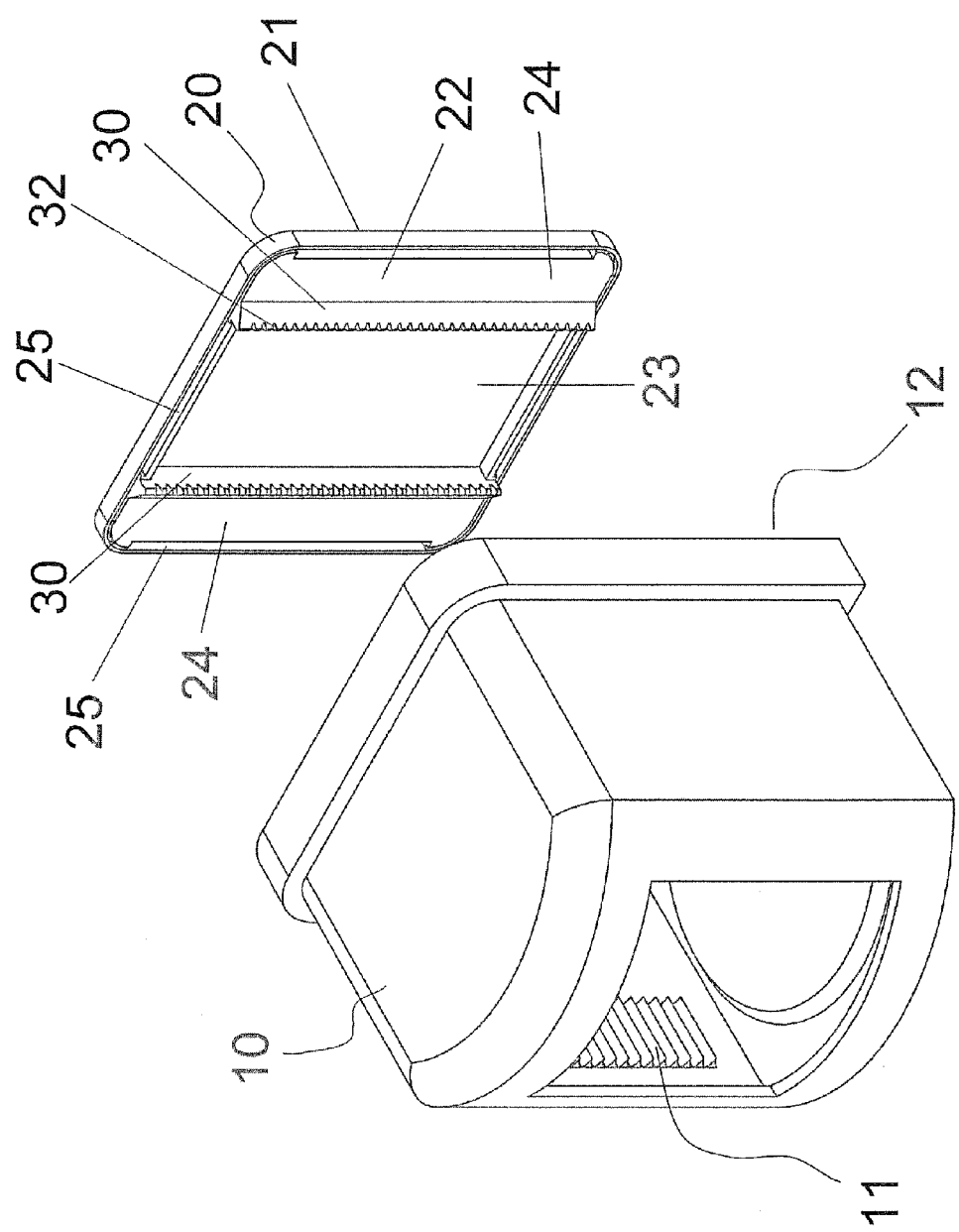
FIG. 3 is a view of the first type of wafer container of the present invention.

First, referring to FIG. 3, which is a view of the first type of wafer container of the present invention. The wafer container is a front opening unified pod (FOUP) that includes a container body 10 and a door 20. Inside the container body 10 is an accommodating space within which a plurality of slots 11 are disposed for supporting a plurality of wafers, and an opening 12 is formed on one sidewall of the container body 10 for importing and exporting the plurality of wafers. The door 20 includes an outer surface 21 and an inner is surface 22. Wherein, around the central area of the inner surface 22 of the door 20 is disposed with a recess 23, and the recess 23 can separate the inner surface 22 of the door 20 into two platforms 24. A restraint module 30 integrated with the door 20 is respectively formed on each of the platforms 24 near the recess 23. On each restraint module 30 are disposed with a plurality of notches 32 arranged at interval. Therefore, when the door 20 is lock-fastened to the container body 10, the notches 32 contact the wafers in the container body 10, allowing a portion of each wafer to extend into the recess 23. In the aforementioned method of lock-fastening the door 20 to the container body 10, magnet 25 is disposed around the inner surface 22 of the door 20 and magnetic member (not shown in Figure) is disposed on the container body 10 corresponding to the magnet 25; the magnet 25 on the door 20 attracts the magnetic member (a metal material for example) on the container body 10 for the door 20 and the opening of the container body 10 to be joined with each other. With the design of which, the cam and sliding devices disposed in the door are not needed, enabling the is thickness of the door to be reduced and the particle generation resulted from operation between the cam and the sliding devices to be avoided. Moreover, in automatic machine a vacuum sucker is sufficient for opening the door and a key bar used for rotating the cam is not needed.

Figure 4:
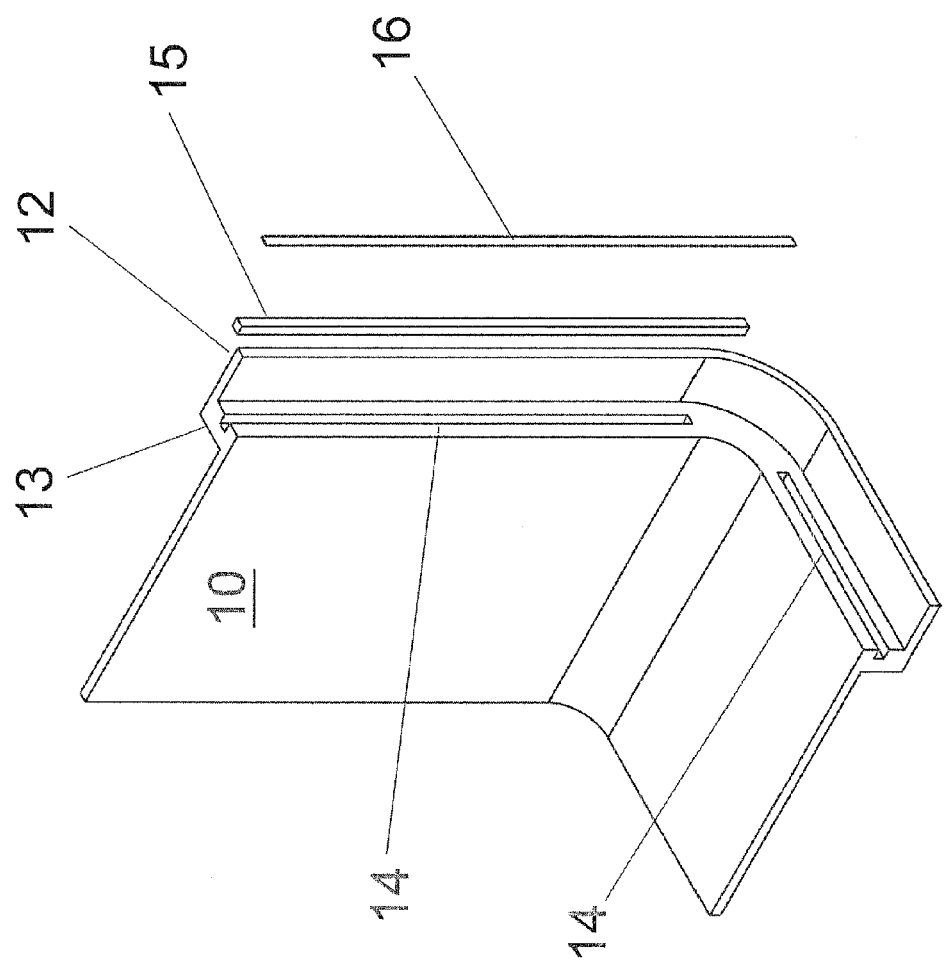
FIG. 4 is a view of the container body of the first type of wafer container of the present invention.
Figure 5:
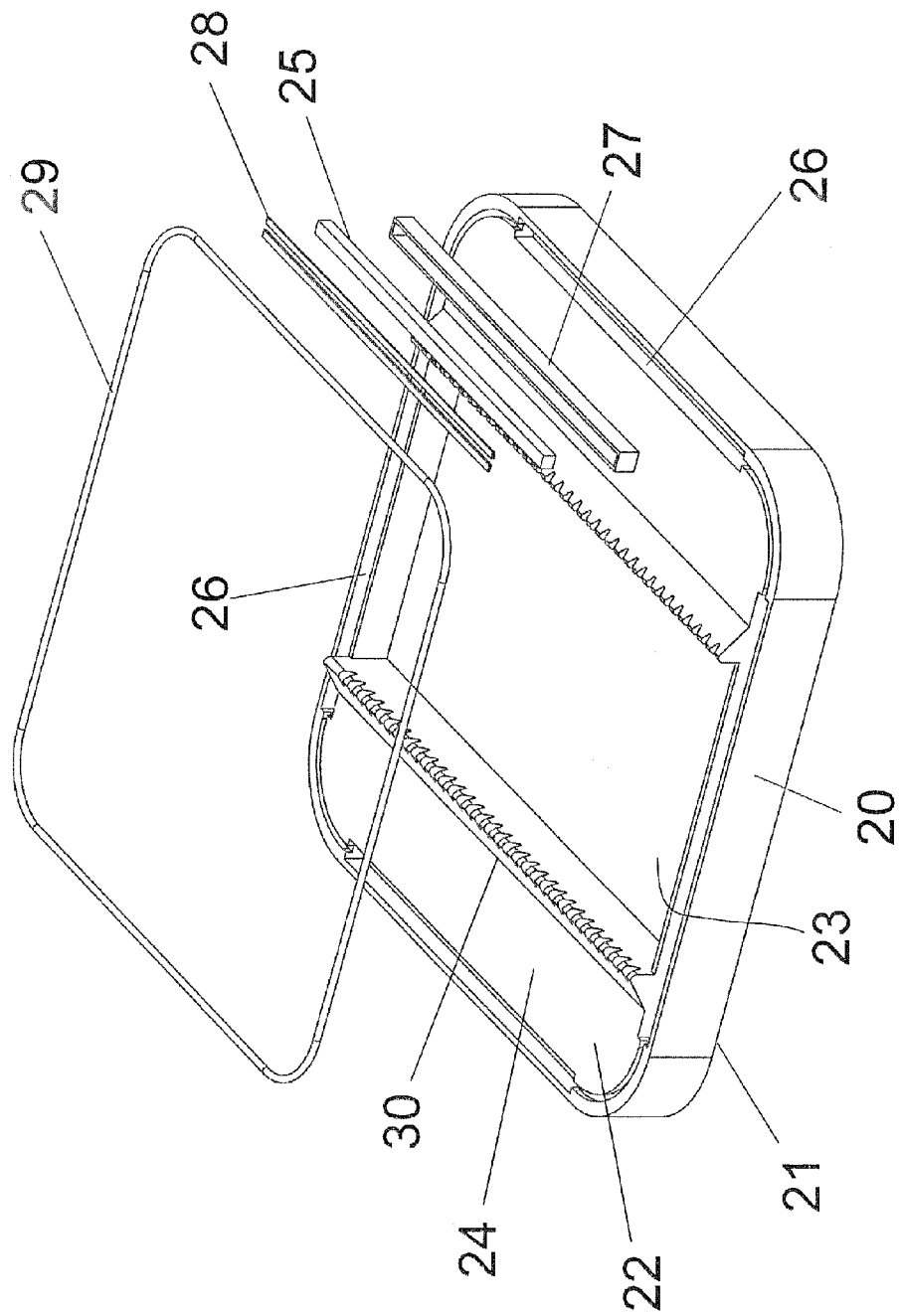
FIG. 5 is a view of the door of the first type of wafer container of the present invention.

Then, referring to FIG. 4 and FIG. 5, which are views of the container body and the door of the wafer container shown in FIG. 3. As shown in FIG. 4, a stage 13 horizontally extending outward is formed between one sidewall of the container body 10 and the opening 12. When the door 20 is joined with the container body 10, the door 20 is placed at the inner edge of the opening 12 and the rim area of the inner surface 22 of the door 20 contacts the stage 13. What is to be described in particular is that first grooves 14 are respectively disposed on the stage 13 around the container body 10, and a magnetic member 15 is respectively embedded into each of the first grooves 14; moreover, when the magnetic members 15 are placed into the first grooves 14, first lids 16 can be further used to fasten each of the first grooves 14 and cover the aforementioned magnetic members 15 in the is present invention. Furthermore, the material of the aforementioned magnetic member 15 can be metal, ceramics, or polymer material, as long as the material has the property of being able to be attracted by the magnet 25. And the material of the first lids 16 can be polymer material, plastic for example.

Figure 6:
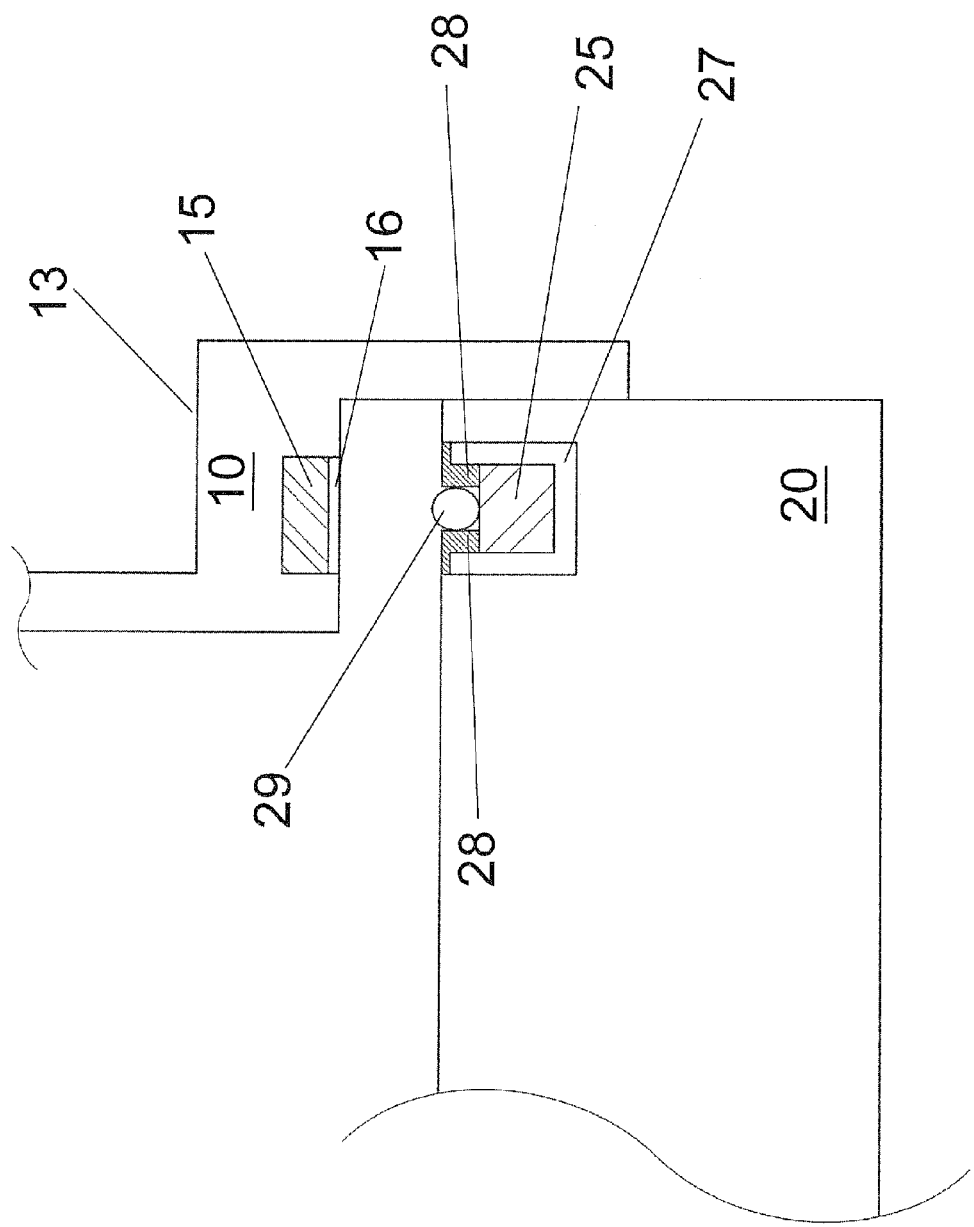
FIG. 6 is a sectional view of the door of the first type of wafer container of the present invention when lock-fastening the container body.

Then, referring to FIG. 5, second grooves 26 are respectively disposed near the four sides of the inner surface 22 of the door 20, i.e., on the inner surface 22 of the door 20 corresponding to magnetic members 15, in each of the second grooves 26 being disposed with a magnetic yoke 27 with "recessed" cross section and in each magnetic yoke 27 being further disposed with magnet 25. The material of the aforementioned magnetic yoke 27 is metal, for example, iron or steel. What is to be emphasized in particular is that the magnetic yoke 27 includes an open side opposite to the stage 13 of the container body 10; therefore, the magnetic yoke 27 can guide or focus the magnetic flux of magnet 25 in the direction of the stage 13 of the container body 10 for the magnetic flux to be concentrated on attracting the magnetic member 15. Moreover, since the magnetic flux can be focused in is the direction of the stage 13 and not in the direction of the wafers in the container body 10, effect on the stability of circuit of wafers in the container body can thus be avoided. In addition, to prevent from particle generation resulted from direct contact between the magnet 25 on the door 20 and the first lid 16 covering the magnetic member 15, in the present invention a second lid 28 made of polymer material is further provided on the side of magnet 25 that is not covered by the magnetic yoke 27 for being fixed to each of the second grooves 26 and magnetic yoke 27. In a preferred embodiment, the second lid 28 of the present invention is a pair of second lids 28 disposed on two side edges of the open side of the magnetic yoke 27 with a gap kept between the pair of lids 28 for a seal element 29 to be accommodated therein. This seal element 29 is a round shaped or a quasi-round shaped O-ring. And since the four corners of the inner surface 22 of the door 20 have gaps that can accommodate the O-ring, thus, as shown in FIG. 6, when the door 20 and the container body 10 are lock-fastened to each other with the magnet 25 on the door 20 attracting the magnetic member 15 on the is container body 10, the aforementioned O-ring contacts the first lid 16 on the container body 10 to isolate gas inside the container body from gas outside the container body.

Figure 7:
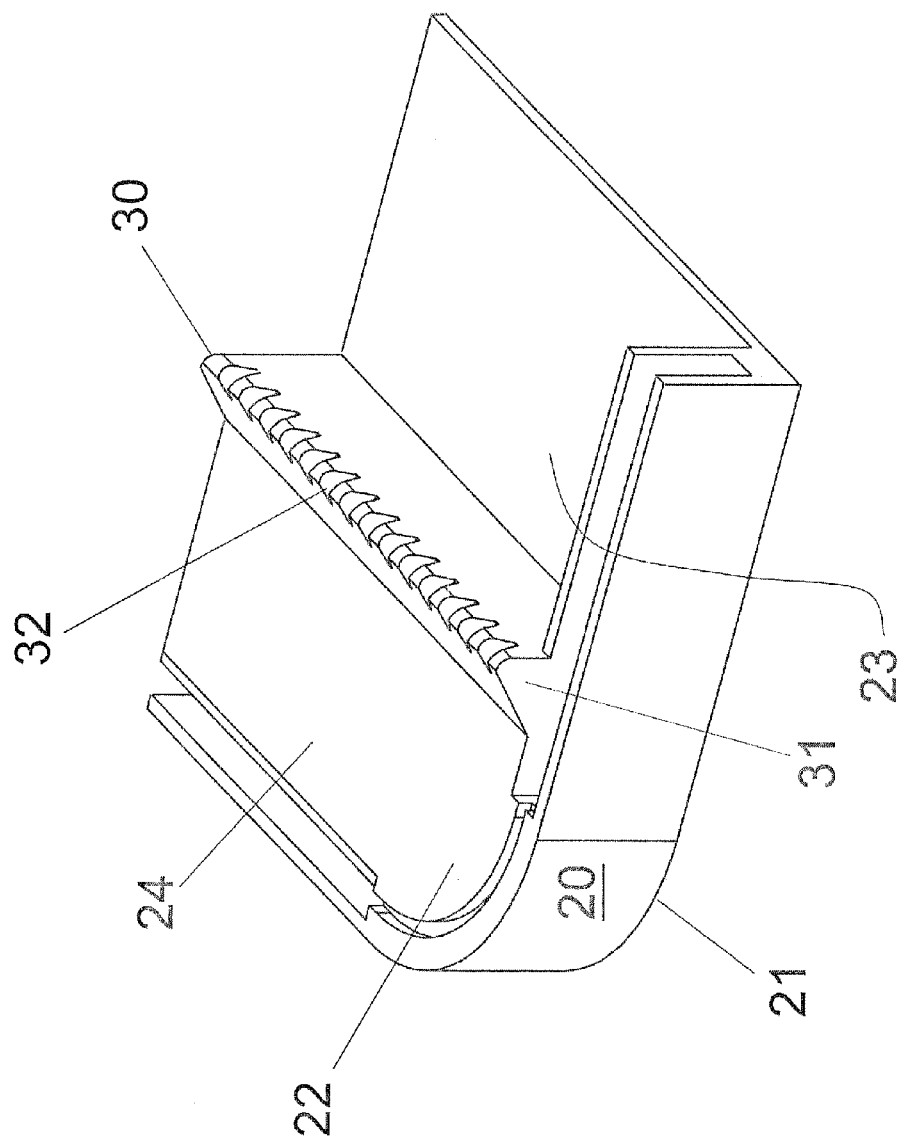
FIG. 7 is a view of the restraint module on the door of the first type of wafer container of the present invention.

Then, referring to FIG. 7, which is a view of the restraint module on the door of the wafer container shown in FIG. 3. As described above, the inner surface 22 of the door 20 is separated into two platforms 24 by the recess 23, and a restraint module 30 integrated with the door 20 is formed on two sides of each of the two platforms 24 near the recess 23. The integration with the door 20 means that the inner surface 22 of the door 20, or the platforms 24, the recess 23, and the two restraint modules 30 are together formed with polymer plastic material by methods such as injection molding or injection compression molding. Each restraint module 30 protrudes from the recess 23 in the direction of the container body 10 and extends toward the platform 24 to form a rectangular bar base 31, and on this rectangular bar base 31 a plurality of notches 32 arranged at interval are further formed. The notches 32 of restraint module 30 on two platforms 24 are correspondingly aligned so that the corresponding right and left notches 32 contact a same wafer for a portion of the wafer to extend into the recess 23 and for simultaneously restraining movement of the wafer in the direction of the opening 12 of the container body 10 during the transportation process. And the notches 32 can be a V-shaped or curved shaped guide notch structure for smoothly guiding and firmly fastening wafers therein. Moreover, the surface of notch 32 can be further coated or applied with a wear-resisting material, such as PEEK material, to reduce friction of the wafer.

Figure 8:
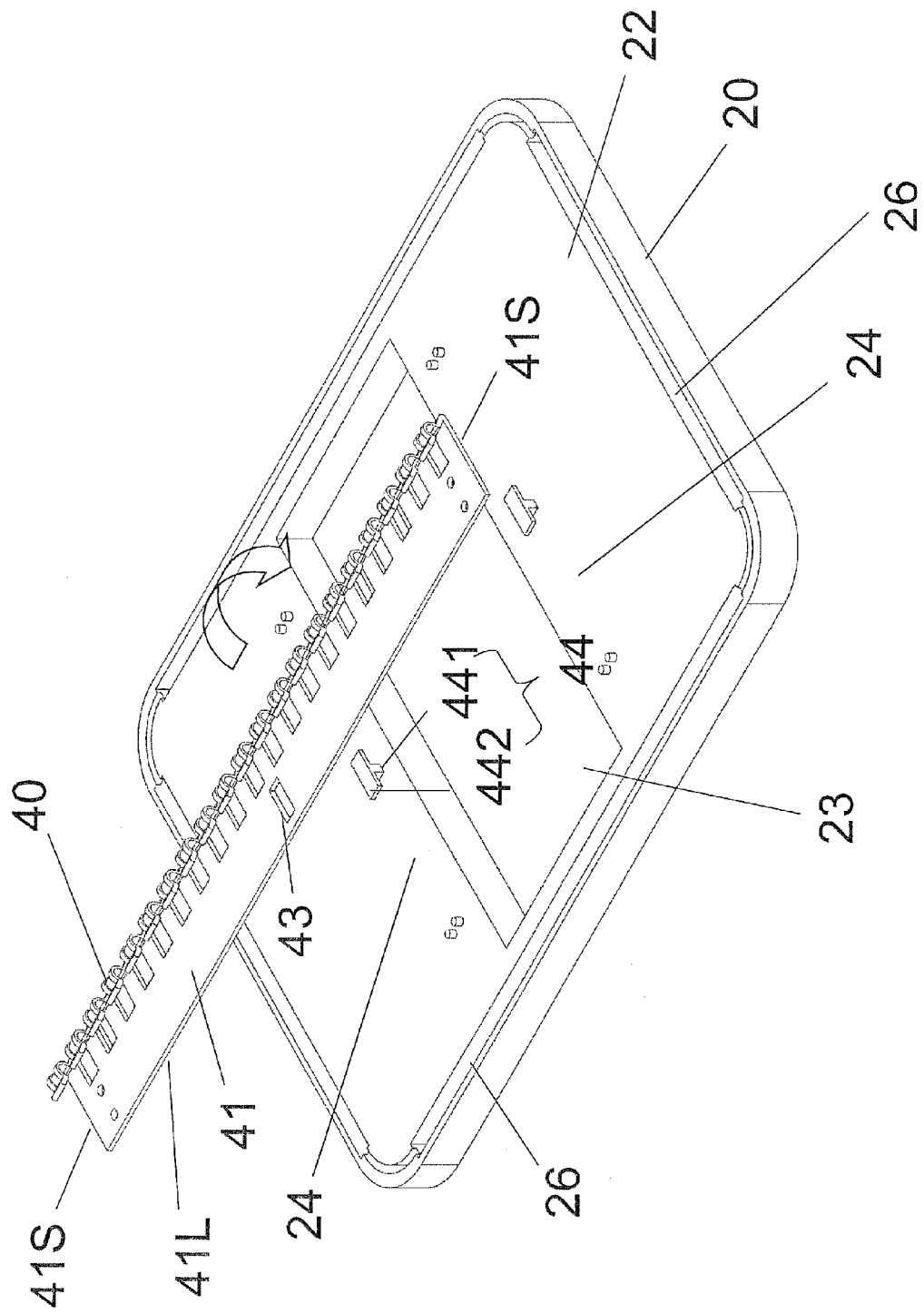
FIG. 8 is a view of the door of the second type of wafer container of the present invention.
Figure 9:
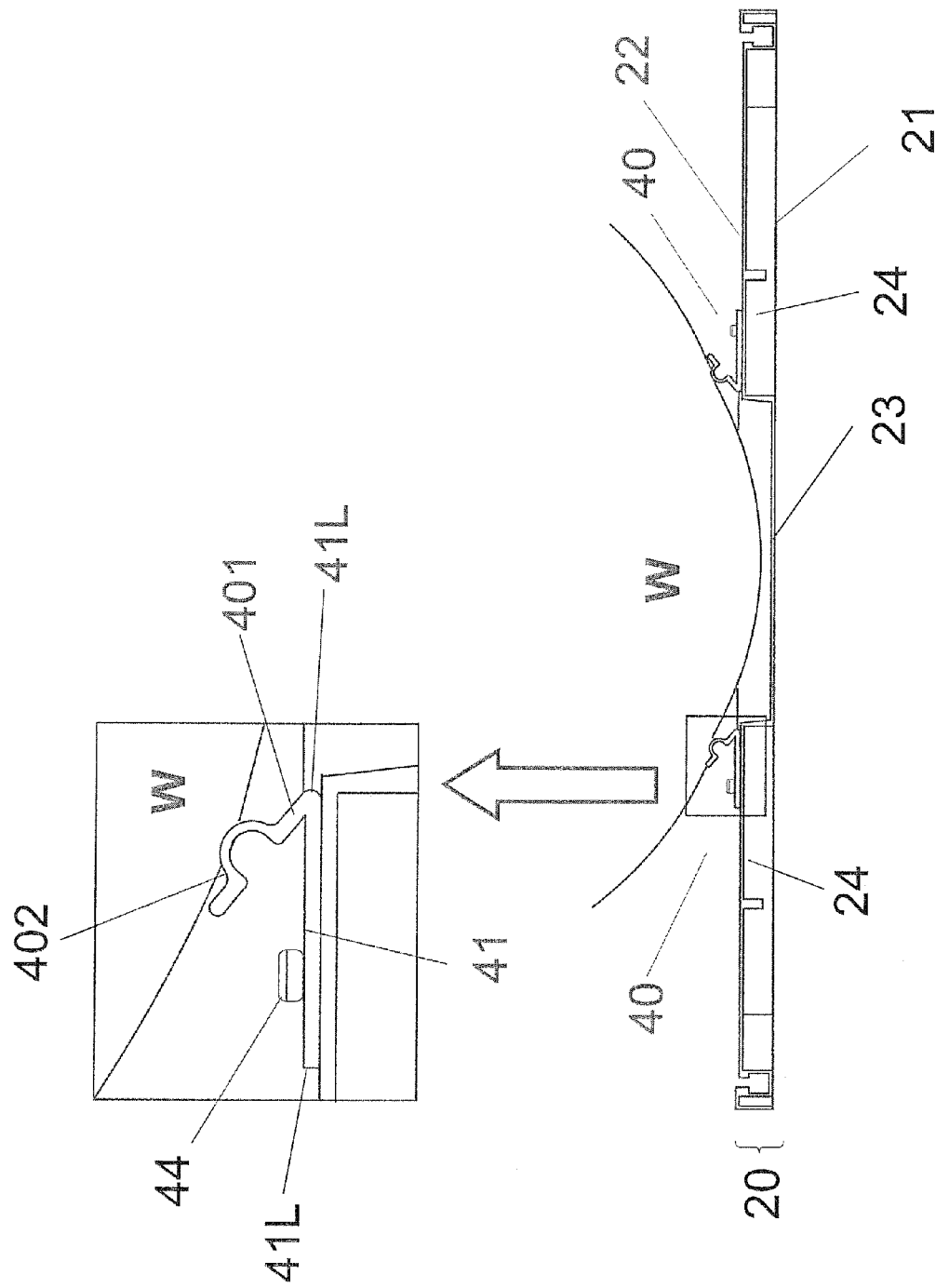
FIG. 9 is a view of the restraint module of the second type of wafer container of the present invention when contacting wafer.
Figure 10:
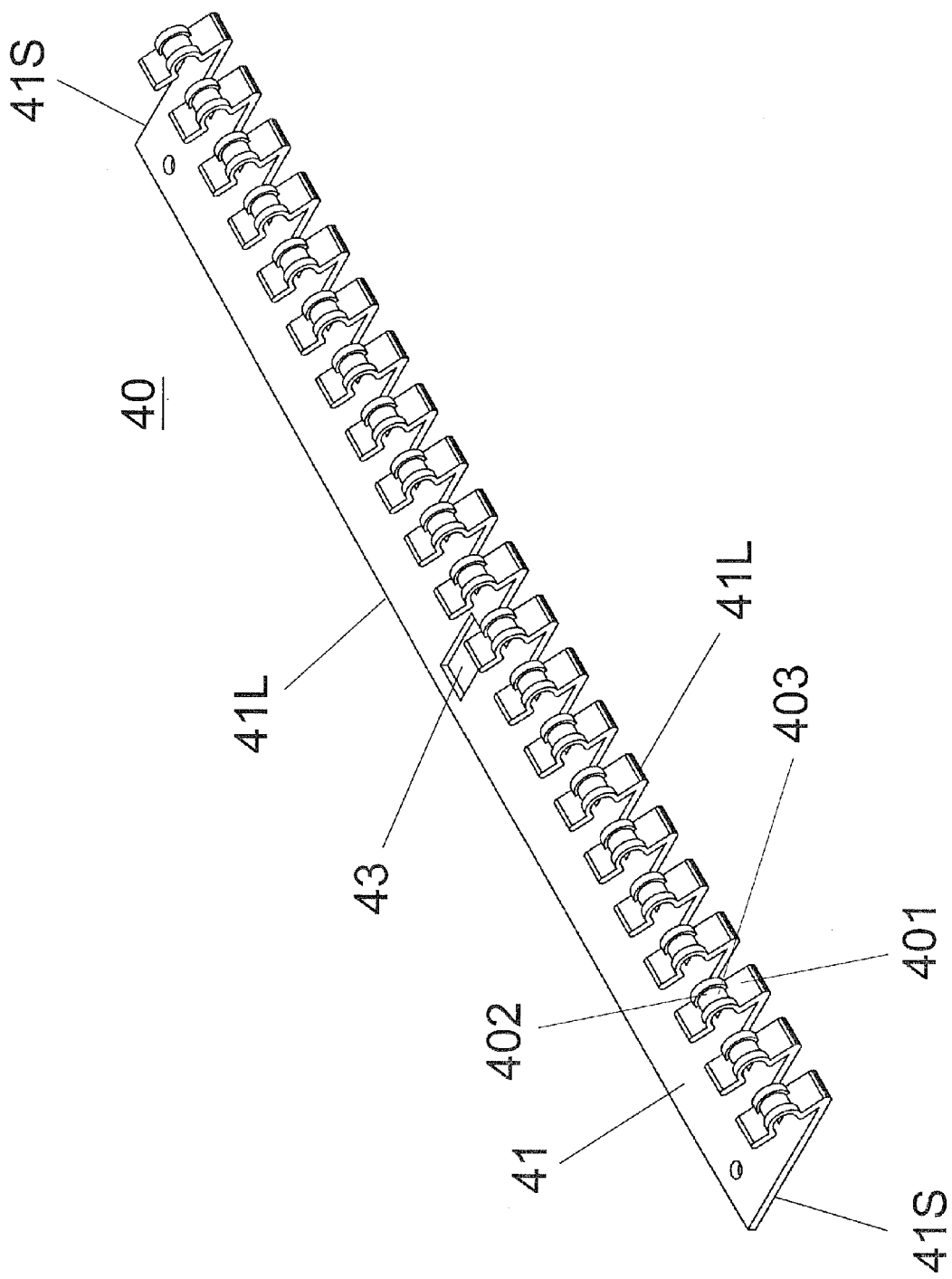
FIG. 10 is a view of the restraint module of the second type of wafer container of the present invention.

Then, referring to FIG. 8, which is a view of the door of the second type of wafer container of the present invention. FIG. 9 is a view of the restraint module of the door shown in FIG. 8 contacting wafer. FIG. 10 is a view of the restraint module of the door shown in FIG. 8. In the second type of wafer container of the present invention, the restraint module on the door is an independent component fixedly turn-fitted on two platforms 24 of the door 20. The restraint module 40 includes a base 41, and the base 41 includes two longer sides 41L and two shorter sides 41S. A plurality of suspended arms 401 are formed by the extension of one longer side 41L nearer to the recess 23, a semicircle-like protruding portion 402 is formed between each suspended arm 401 and its free end, and on the protruding portion 402 is disposed with a central guide notch 403 for contacting wafer in the container body. And the surface of central guide notch 403 that contacts wafer can be coated or applied with a wear-resisting material, such as polyetheretherketone (PEEK), to reduce friction and generation of dust particles. Moreover, the width of central guide notch 403 can be equal to the thickness of wafer for the wafer to sink into the central guide notch 403 without moving up and down. Apparently, an angle is formed between the aforementioned base 41 and the suspended arm 401, and the degree of angle can be 10~60 degrees.

On the aforementioned base 41 mounting hole 43 is included, and the shape of mounting hole 43 can be rectangular, rhombus-like, or oval. On the inner surface 22 of the door 20 is disposed with a snap-fitting piece 44, which includes protruding portion 441 and snap-fitting portion 442, one end of the protruding portion 441 being fixed on the inner surface 22 of the door 20 and the other end, or so-called free end, being connected to the snap-fitting portion 442. The shape or size of the snap-fitting portion 442 is the same as that of the mounting hole 43 of the base 41, and the shape can be rectangular, rhombus-like, or oval. Therefore, the snap-fitting piece 44 can pass through the mounting hole 43 on the base 41 and after the restraint module 40 is rotated to an angle (90 degrees clockwise as shown in FIG. 8), the snap-fitting piece 44 snap-fits the base 41 of the restraint module 40 and fixes the restraint module 40 on the inner surface 22 of the door 20.

Figure 11:
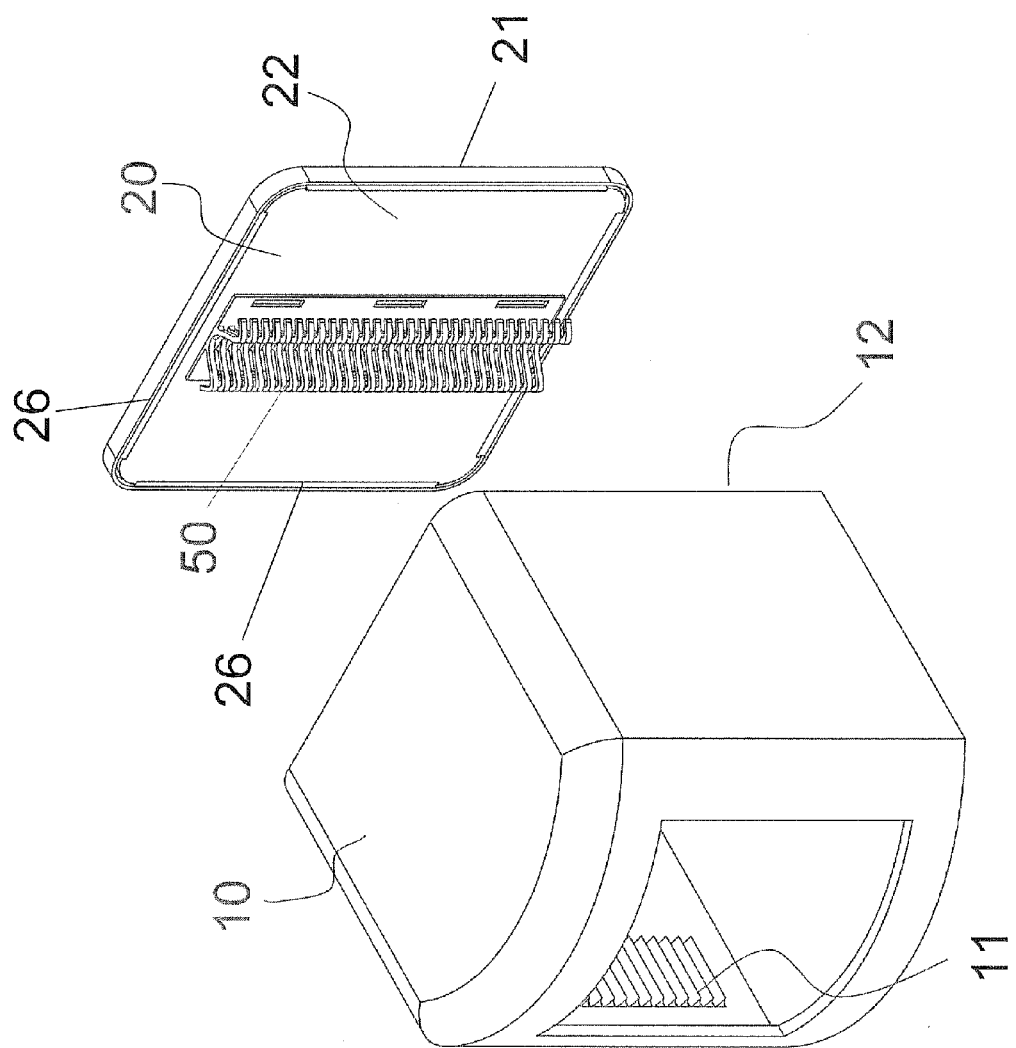
FIG. 11 is a view of the third type of wafer container of the present invention.
Figure 12:
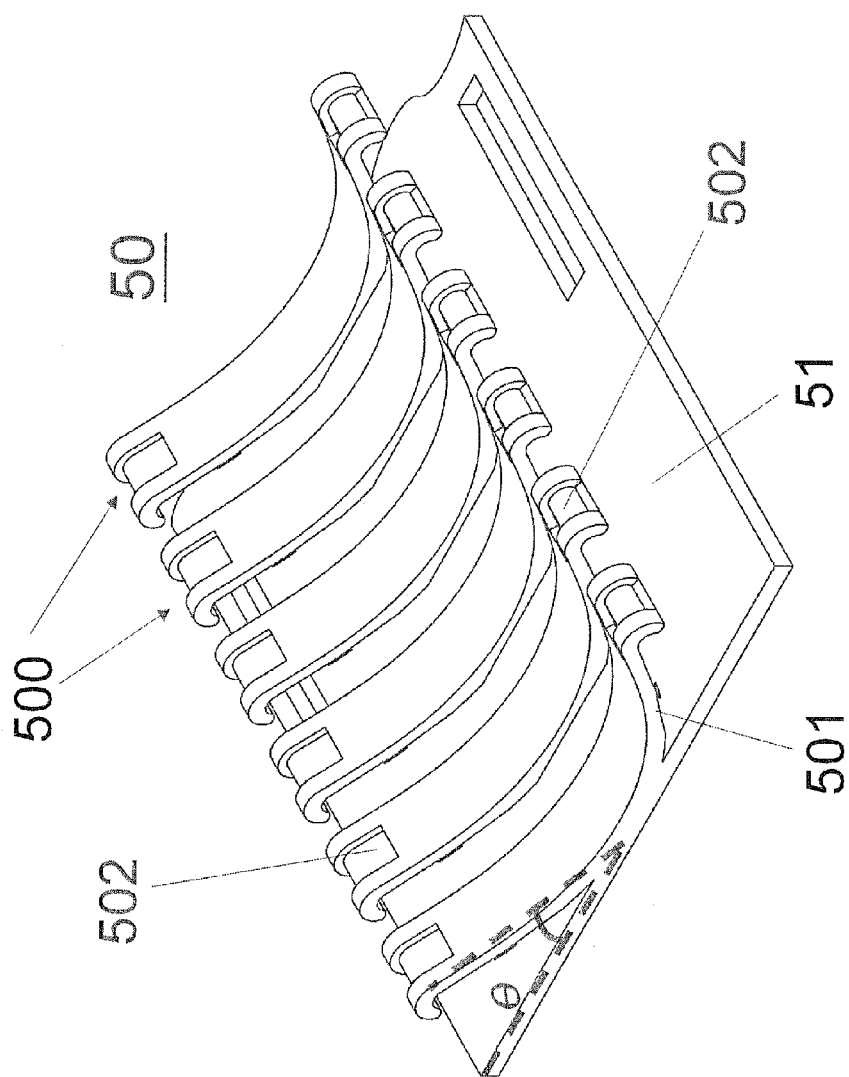
FIG. 12 is a view of the restraint module of the third type of wafer container of the present invention.

Then, referring to FIG. 11, which is a view of the third type of wafer container of the present invention. FIG. 12 is a view of the restraint module 50 of wafer container shown in FIG. 11. The inner surface 22 of the door 20 of the wafer container in this embodiment does not include recess 23 as shown in FIG. 7 or FIG. 8 and the restraint module 50 is disposed in the central area of the inner surface 22 of the door 20. The restraint module 50 includes a base 51 and the central area of the base 51 includes a plurality of restraint components 500, there being gap between the neighboring restraint components 500 for the restraint components 500 to correspond with opposite wafers in the container body 10. In each of the aforementioned restraint components 500 a curve portion 501 is formed from center of the base 51 toward two sides and a guide notch 502 is formed at the free end of each curve portion 501 for contacting wafer. The surface of guide notch 502 that contacts wafer can be coated or applied with a wear-resisting material, such as PEEK material, to reduce friction or generation of dust particles. An angle θ is formed between the aforementioned base 51 and the curve portion 501, and the angle can be 10 to 60 degrees. The smaller the angle is, the longer the distance is between the right and left notches 502, providing restricting force in the direction of outer edge of the opening; when the angle is larger, the restricting force is focused on the center of the opening direction.

What is to be described in particular is that the restraint modules shown in the aforementioned FIG. 8 to FIG. 10 and in FIG. 11 to FIG. 12 are different, but both these two restraint modules can be mounted on the inner surface 22 of the door 20. Near the four sides of the inner surface 22 of the door 20 are structures of second groove 26, magnetic yoke 27, magnet 25, second lid 28, and seal element 29 as shown in FIG. 5, and thus the door 20 can be joined with the container body 10 via magnetic attraction. Moreover, in the three above-mentioned embodiments, the magnet 25 and the magnetic member 15 are separated into four components, but in the present invention the magnet 25 and the magnetic member 15 can also be consecutive with grooves being formed on four corners of the container body 10 and the door 20 and the consecutive magnet 25 and magnetic member 15 being placed therein. When consecutive magnet 25 and magnetic member 15 are used, the seal element 29 is consecutively or completely fixedly sandwiched between the magnet 25 and the magnetic member 15, and thus better effect of air tightness is achieved in this wafer container.

Figure 13:
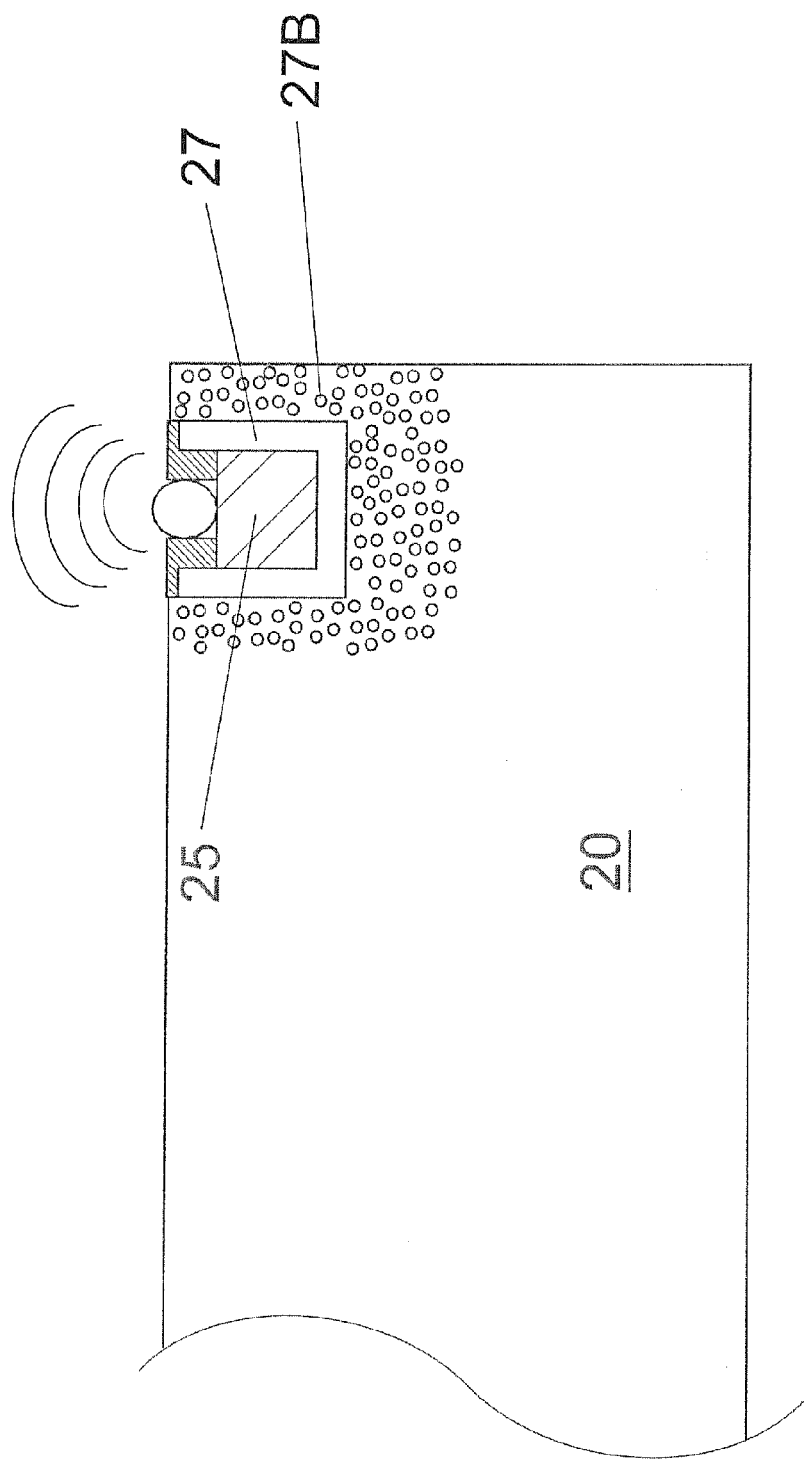
FIG. 13 is a view of the door of wafer container of the present invention being mixed with metal particles.

Then, referring to FIG. 13, repeated injection molding can be further used for mixing metal particles 27B, iron particle for example, in the area surrounding the magnetic yoke 27 in the door 20. With the additional metal particles 27B, the magnetic flux leaking from the side of opening of the magnetic yoke 27 can be attracted or the magnetic flux leaking from the magnetic yoke 27 can also be attracted. Moreover, what is to be emphasized in particular here is that the above description of wafer container of the present invention is made based on an embodiment in which the magnet 25 is disposed in the door 20 and the magnetic member 15 is disposed on the container body 10. However, the magnetic yoke 27, the magnet 25, the second lid 28, and the seal element 29 in the present invention can also be disposed in the stage 13 of the container body 10 whereas the magnetic member 15 and the first lid 16 are disposed in the door 20, with the deployment of which the door 20 and the container body 10 can still be lock-fastened to each other.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer container including a container body for supporting a plurality of wafers therein with an opening formed on a sidewall of said container body for importing and exporting said plurality of wafers, a door with an outer surface and an inner surface, said door joining with said opening of said container body via said inner surface, the characteristic of said wafer container in that:
    a magnetic member is buried in a first groove at inner edge of said opening of said container body and a magnet is disposed on said inner surface of said door corresponding to said magnetic member, said magnet being disposed in a magnetic yoke with recessed cross section in a second groove buried near the four sides of said inner surface of said door, with said magnet of said door attracting said magnetic member at opening of said container body, said door and said container body being lock-fastened to each other.

2. The wafer container according to claim 1, wherein said magnetic member of said container body is selected from the group consisting of: metal material, ceramic material, and polymer material.

3. The wafer container according to claim 1, wherein a first lid is further disposed on said magnetic member of said container body.

4. The wafer container according to claim 1, wherein said magnetic yoke is made of metal material.

5. The wafer container according to claim 1, wherein said magnet of said door includes one outer surface that is not covered by said magnetic yoke, and said outer surface is covered by a pair of lids, a gap being included between said pair of lids for a seal element to be accommodated therein.

6. The wafer container according to claim 1, wherein a recess is disposed on said inner surface by being integrated with said door for separating said inner surface into two platforms, and a restraint module is respectively formed on each of said two platforms, each of said restraint module including a base and a plurality of notches arranged at interval being disposed on said base for contacting said plurality of wafers in said container body.

7. The wafer container according to claim 1, wherein a recess is disposed on said inner surface of said door for separating said inner surface into two platforms and a restraint module is fixedly connected on each of said two platforms respectively, said restraint module including a base and extension of one longer side of said base forming a plurality of suspended arms, a semicircle-like protruding portion being formed between each of said suspended arms and its free end, and a central guide notch being disposed on said protruding portion for contacting said plurality of wafers in said container body.

8. The wafer container according to claim 1, wherein a restrict ion module is disposed in central area of said inner surface of said door, said restriction module including a base, a plurality of restraint components arranged at interval extending from center of said base to two sides, each of said restraint components including a curve portion and a guide notch being formed at free end of said curve portion for contacting wafer.

9. A wafer container including a container body for supporting a plurality of wafers therein with an opening formed on a sidewall of said container body for importing and exporting said plurality of wafers, a door with an outer surface and an inner surface, said door joining with said opening of said container body via said inner surface, the characteristic of said wafer container in that:
    a magnetic yoke with recessed cross section is buried in a first groove at inner edge of said opening of said container body, a magnet being disposed in said magnetic yoke with recessed cross section in a second groove buried near the four sides of said inner surface of said door, and a magnetic member being disposed on said inner surface of said door corresponding to said magnet; with said magnet of said container body attracting said magnetic member of said door, said door and said container body being lock-fastened to each other.

10. The wafer container according to claim 9, wherein said magnetic member of said door is selected from the group consisting of: metal material, ceramic material, and polymer material.

11. The wafer container according to claim 9, wherein said magnetic member of said door corresponds to said magnet with an outer surface and said outer surface is covered by a lid.

12. The wafer container according to claim 9, wherein said magnetic yoke is made of metal material.

13. The wafer container according to claim 9, wherein said magnet of said container body includes one outer surface that is not covered by said magnetic yoke, and said outer surface is covered by a pair of lids, a gap being included between said pair of lids for a seal element to be accommodated therein.

14. The wafer container according to claim 9, wherein a recess is disposed on said inner surface by being integrated with said door for separating said inner surface into two platforms, and a restraint module is respectively formed on each of said two platforms, each of said restraint module including a base and a plurality of notches arranged at interval being disposed on said base for contacting said plurality of wafers in said container body.

15. The wafer container according to claim 9, wherein a recess is disposed on said inner surface of said door for separating said inner surface into two platforms and a restraint module is fixedly connected on each of said two platforms respectively, said restraint module including a base and extension of one longer side of said base forming a plurality of suspended arms, a semicircle-like protruding portion being formed between each of said suspended arms and its free end, and a central guide notch being disposed on said protruding portion for contacting said plurality of wafers in said container body.

16. The wafer container according to claim 9, wherein a restrict ion module is disposed in central area of said inner surface of said door, said restriction module including a base, a plurality of restraint components arranged at interval extending from center of said base to two sides, each of said restraint components including a curve portion and a guide notch being formed at free end of said curve portion for contacting wafer.

17. A wafer container including a container body for supporting a plurality of wafers therein with an opening formed on a sidewall of said container body for importing and exporting said plurality of wafers, a door with an outer surface and an inner surface, said door joining with said opening of said container body via said inner surface, the characteristic of said wafer container in that:

a magnetic member is buried in a first groove at inner edge of said opening of said container body and a magnet is disposed on said inner surface of said door corresponding to said magnetic member, said magnet being disposed in a magnetic yoke with recessed cross section in a second groove buried near the four sides of said inner surface of said door and said door being mixed with metal particles; with design of which said magnet of said door attracting said magnetic member at opening of said container body for said door and said container body to be lock-fastened to each other.

18. The wafer container according to claim 17, wherein said magnetic member of said door is selected from the group consisting of: metal material, ceramic material, and polymer material.

19. The wafer container according to claim 17, wherein said magnetic member of said container body corresponds to said magnet with an outer surface and said outer surface is covered by a lid.

20. The wafer container according to claim 17, wherein said magnetic yoke is made of metal material.

* * * * *